United States Patent
Fudo et al.

(10) Patent No.: US 12,083,832 B2
(45) Date of Patent: Sep. 10, 2024

(54) TIRE DETERIORATION INFERRING DEVICE AND TIRE DETERIORATION INFERRING METHOD

(71) Applicant: Alps Alpine Co., Ltd., Tokyo (JP)

(72) Inventors: Heishiro Fudo, Miyagi-ken (JP); Eiji Shinohara, Niigata-ken (JP); Shinya Ichise, Miyagi-ken (JP); Hiroyuki Tobari, Miyagi-ken (JP); Akihito Yamamoto, Miyagi-ken (JP); Yuki Ono, Niigata-ken (JP)

(73) Assignee: Alps Alpine Co., Ltd., Tokyo (JP)

(*) Notice: Subject to any disclaimer, the term of this patent is extended or adjusted under 35 U.S.C. 154(b) by 387 days.

(21) Appl. No.: 17/535,207

(22) Filed: Nov. 24, 2021

(65) Prior Publication Data

US 2022/0080779 A1 Mar. 17, 2022

Related U.S. Application Data

(63) Continuation of application No. PCT/JP2020/010984, filed on Mar. 13, 2020.

(30) Foreign Application Priority Data

Jun. 14, 2019 (JP) ................. 2019-111194

(51) Int. Cl.
*B60C 11/24* (2006.01)
*B60C 23/06* (2006.01)

(52) U.S. Cl.
CPC .......... *B60C 11/246* (2013.01); *B60C 23/064* (2013.01)

(58) Field of Classification Search
CPC .................................................. G01M 17/02
See application file for complete search history.

(56) References Cited

U.S. PATENT DOCUMENTS

2010/0186492 A1   7/2010  Morinaga
2015/0328942 A1*  11/2015 Weston ............... B60C 23/0411
                                                           73/146
2018/0079262 A1   3/2018  Masago

FOREIGN PATENT DOCUMENTS

JP       2005-345238       12/2005
JP       2009-061917        3/2009
(Continued)

OTHER PUBLICATIONS

Japanese Office Action (Notice of Reasons for Refusal dated Oct. 24, 2022) mailed on Nov. 1, 2022 from Japanese Application No. 2021-525917, with translation.

(Continued)

*Primary Examiner* — Lisa M Caputo
*Assistant Examiner* — Cynthia L Davis
(74) *Attorney, Agent, or Firm* — Beyer Law Group LLP

(57) ABSTRACT

A tire deterioration inferring (estimating) method uses a tire deterioration inferring device placed on the inner surface of a tire. The method has: a deformation velocity measurement step of measuring a tire deformation velocity, which is the deformation velocity of the tire while the tire is rotating, and obtaining time-series changes in the tire deformation velocity; a calculation step of calculating peak values of the tire deformation velocity from the time-series changes in the tire deformation velocity; and an inference step of inferring the degree of the deterioration of the tire by using a first peak value, which is a peak value of the tire deformation velocity before and at the stepping of the tire or at and after the kicking of the tire, the first peak value being in the time-series changes in the tire deformation velocity.

11 Claims, 11 Drawing Sheets

(56) References Cited

FOREIGN PATENT DOCUMENTS

| | | | | |
|---|---|---|---|---|
| JP | 2011-168211 | | 9/2011 | |
| JP | 2011168211 A | * | 9/2011 | ........... B60C 11/246 |
| JP | 5111505 B | | 10/2012 | |
| JP | 2016-190615 | | 11/2016 | |
| WO | 2009/008502 | | 1/2009 | |

OTHER PUBLICATIONS

International Search Report for PCT/JP2020/010984 dated Jun. 2, 2020.

* cited by examiner

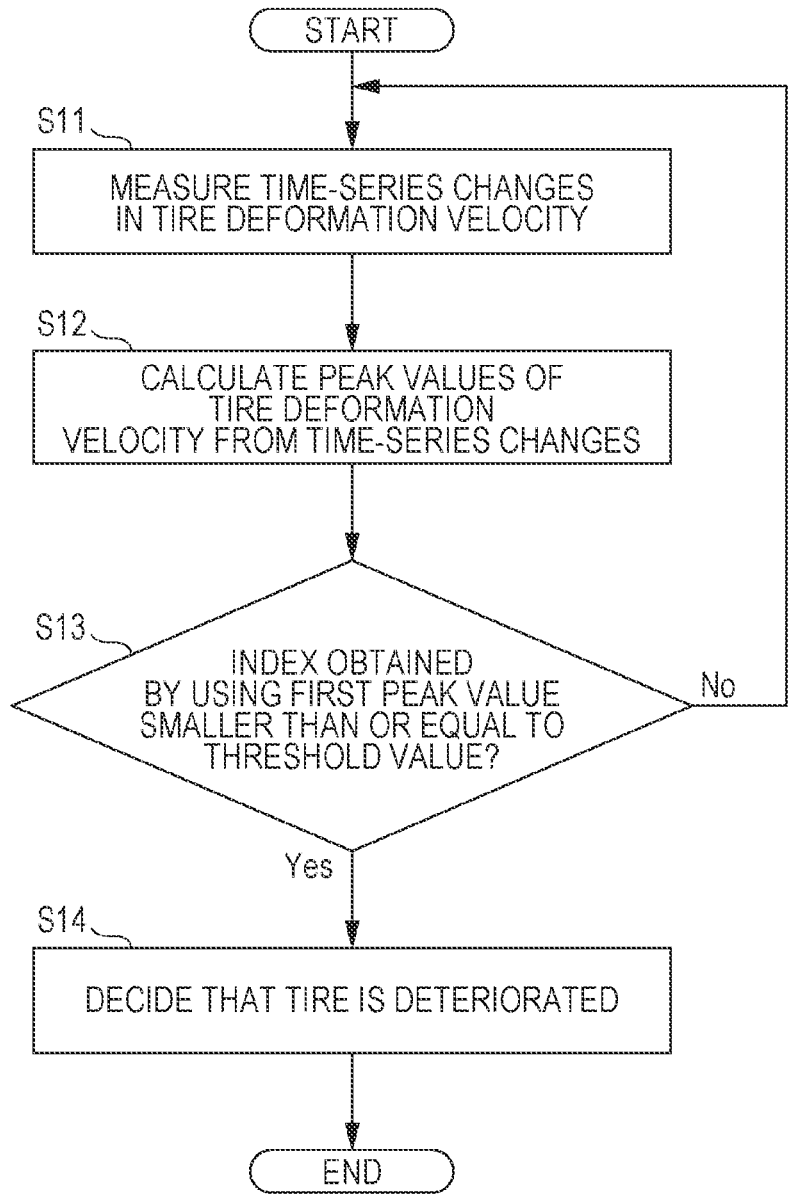

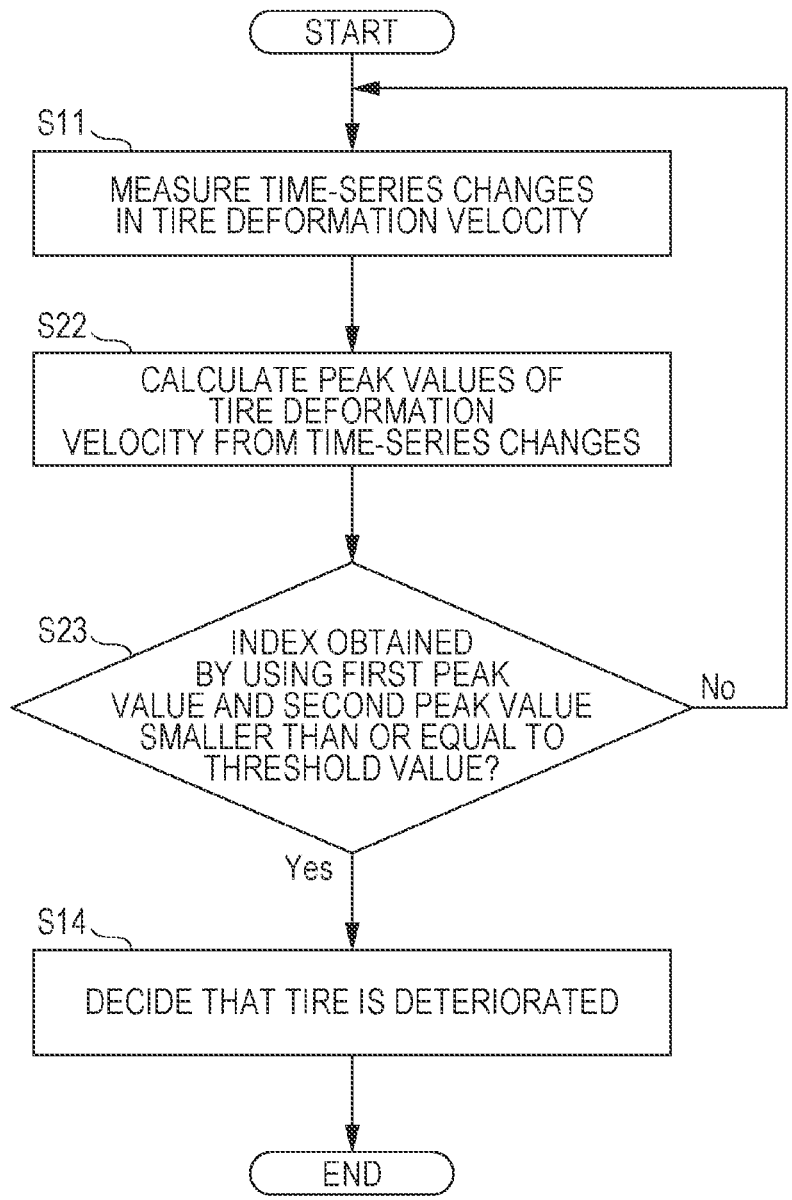

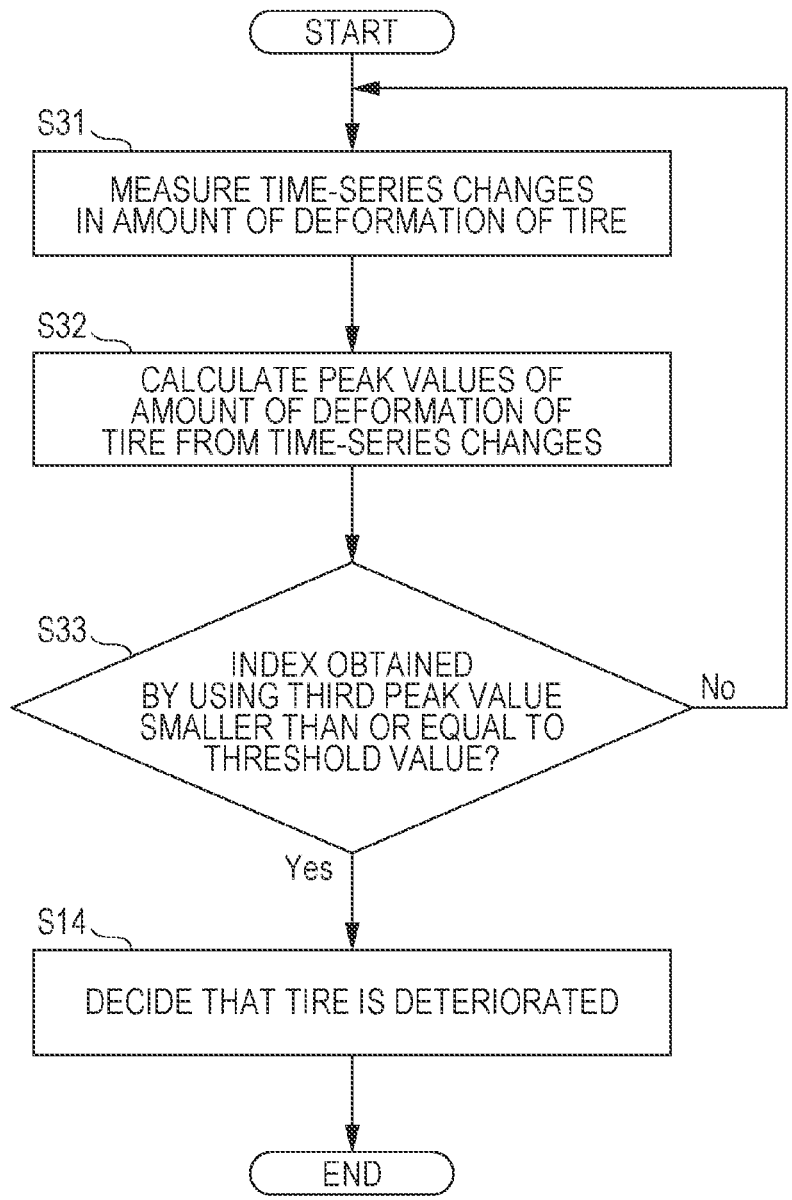

TIRE DETERIORATION INFERRING DEVICE AND TIRE DETERIORATION INFERRING METHOD

CLAIM OF PRIORITY

This application is a Continuation of International Application No. PCT/JP2020/010984 filed on Mar. 13, 2020, which claims benefit of Japanese Patent Application No. 2019-111194 filed on Jun. 14, 2019. The entire contents of each application noted above are hereby incorporated by reference.

BACKGROUND OF THE INVENTION

1. Field of the Invention

The present invention relates to a tire deterioration inferring device and a tire deterioration inferring method that infer the extent of the deterioration, of a tire, that is caused by wear or the like.

2. Description of the Related Art

As the wear of a tire proceeds, grip performance is lowered during a travel on a dry road surface and drainage performance by which water is drained between a tire and the road surface is also lowered during a travel on a wet road surface. To prevent this, the driver or vehicle manager visually checks the tread for wear, and replaces the tire before the usage limit is exceeded to assure safety. Although a slip sign provided in a groove on the tire or the like is used in visual check, inspection work is complex and the wear state may be incorrectly evaluated. If the evaluation is incorrect, the tire will continue to be used in spite of its performance having lowered. This is not preferable from the viewpoint of safety.

Thus, a method in which the extent of the wear of a tire is inferred (estimated) by other than visual check is proposed. For example, a method in which the extent of the wear of a tire is inferred stably and accurately is described in Japanese Patent No. 5111505.

SUMMARY OF THE INVENTION

In the method described in Japanese Patent No. 5111505, a tire deformation velocity is calculated from acceleration in the radial direction of the tire, a tire rotation time is obtained, an index for the deformation velocity is obtained from the deformation velocity and rotation time, and the degree of wear is calculated from the magnitude of the index. To standardize the index of the deformation velocity of the tire, the deformation velocity varying with the rotational speed, multiplication or division by the cubic value of the rotation time of the tire is performed. Since, in this method, the extent of wear is obtained in consideration of a plurality of data items such as the load of the tire, pressure, velocity, the coefficient of friction of the road surface, the amount of calculation required to infer (estimate) the extent of the wear of the tire is increased. This is problematic in that the tire deterioration inferring (estimating) device consumes much more electric power.

Consequently, the object of the present invention is to provide a tire deterioration inferring (estimating) device and a tire deterioration inferring (estimating) method that can infer (estimate) the extent of the deterioration of a tire by a method different from the conventional method.

The present invention is based on the finding that the extent of the deterioration, of a tire, that is caused by wear, a reduction in flexibility, or the like can be evaluated by using deformation before and at the stepping of the tire (that is, before a ground contact) or at and after the kicking of the tire (that is, after the ground contact) as well as deformation at the ground contact of the tire. The present invention has arrangements described below.

A tire deterioration inferring method in the present invention uses a tire deterioration inferring device placed on the inner surface of a tire. The method has: a deformation velocity measurement step of measuring a tire deformation velocity, which is the deformation velocity of the tire while the tire is rotating, and obtaining time-series changes in the tire deformation velocity; a calculation step of calculating peak values of the tire deformation velocity from the time-series changes in the tire deformation velocity; and an inference (estimation) step of inferring the degree of the deterioration of the tire by using a first peak value, which is a peak value of the tire deformation velocity before and at the stepping of the tire or at and after the kicking of the tire, the first peak value being in the time-series changes in the tire deformation velocity.

When the first peak value, which is a peak value of the tire deformation velocity before and at the stepping of the tire or at and after the kicking of the tire, is used, the extent of the deterioration of the tire can be accurately inferred.

The calculation step may calculate, from the time-series changes, the first peak value, which is a peak value of the tire deformation velocity before and at the stepping of the tire or at and after the kicking of the tire, and a second peak value, which is a peak value of the tire deformation velocity at a ground contact of the tire. The inference step may infer the degree of the deterioration of the tire according to the ratio between the second peak value and the first peak value.

When the second peak value is calculated besides the first peak value and the ratio between these values is used to infer the degree of the deterioration of the tire, accuracy in inference can be improved with the suppression of the effect of changes caused by changes in external temperature and the like.

The inference step may infer the degree of the deterioration of the tire according to a first ratio obtained by dividing the first peak value before the ground contact by the second peak value or a second ratio obtained by dividing the first peak value after the ground contact by the second peak value.

When the ratio of the first peak value to the second peak value falls to or below 50% or less of a reference value, the inference step may infer that the tire has deteriorated.

A tire deterioration inferring method in another aspect of the present invention uses a tire deterioration inferring device placed on the inner surface of a tire. The method has: a deformation amount measurement step of measuring a tire deformation velocity, which is the deformation velocity of the tire while the tire is rotating, and obtaining time-series changes in the amount of deformation of the tire, the amount being obtained by integrating the tire deformation velocity, a calculation step of identifying peak values of the amount of deformation of the tire from the time-series changes in the amount of deformation of the tire; and an inference step of inferring the degree of the deterioration of the tire by using a third peak values, which is a peak value of the amount of deformation of the tire before and at the stepping of the tire or at and after the kicking of the tire, the third peak value being in the time-series changes in the amount of deformation of the tire.

The deformation amount measurement step may calculate, from the time-series changes, the third peak value of the amount of deformation of the tire before and at the stepping of the tire or at and after the kicking of the tire and a fourth peak value of the amount of deformation of the tire at a ground contact of the tire. The inference step may infer the degree of the deterioration of the tire according to the ratio between the third peak value and the fourth peak value.

A tire deterioration inferring device is placed on the inner surface of a tire to determine the deterioration state of the tire. The tire deterioration inferring device has: a deformation measurement unit capable of measuring the deformation of the tire while the tire is rotating; a calculation unit that calculates, from time-series changes in a tire deformation velocity, a first peak value in the time-series changes in the tire deformation velocity before and at the stepping of the tire or at and after the kicking of the tire; and an inference (estimation) unit that infers the degree of the deterioration of the tire by using the first peak value of the tire deformation velocity.

The calculation unit may calculate, from the time-series changes in the tire deformation velocity, the first peak value before and at the stepping of the tire or at and after the kicking of the tire and a second peak value of the tire deformation velocity at a ground contact of the tire. The inference unit may infer the degree of the deterioration of the tire by using the first peak value and the second peak value.

The deformation measurement unit may be a piezoelectric sensor formed like a sheet. The deformation measurement unit may be placed so as to be in contact with the inner surface of the tire. The deformation measurement unit may measure the deformation velocity of the inner surface of the tire. The measured deformation velocity may be regarded as the tire deformation velocity.

The piezoelectric sensor may have a first piezoelectric sensor and a second piezoelectric sensor. The first piezoelectric sensor and the second piezoelectric sensor may have different sensitivities in the direction in which the tire deforms.

The first piezoelectric sensor may have a higher sensitivity in the width direction of the tire than the second piezoelectric sensor. For example, the first piezoelectric sensor may be formed in a rectangular shape when viewed from the normal direction, and may be placed so that the longitudinal direction matches the width direction of the tire. The second piezoelectric sensor may be formed in a circular shape when viewed from the normal direction. The first piezoelectric sensor and the second piezoelectric sensor may be placed on the same straight line along the rotational direction of the tire.

When the piezoelectric sensor is composed of the first piezoelectric sensor and second piezoelectric sensor that have different sensitivities in the deformation direction of the tire, the difference between the output of the first piezoelectric sensor and the output of the second piezoelectric sensor can be used to detect deformation in a particular direction such as, for example, the width direction of the tire.

The inference unit may infer the degree of the deterioration of the tire by using the first peak value of the tire deformation velocity before and at the stepping of the tire or at and after the kicking of the tire, the first peak value being based on measurement results of the first piezoelectric sensor, and the second peak value of the tire deformation velocity at the ground contact of the tire, the second peak value being based on measurement results of the second piezoelectric sensor.

The inference unit may infer the degree of the deterioration of the tire according to the ratio of the first peak value to the second peak value or to the difference between the first peak value of the tire deformation velocity, the first peak value being based on the measurement result of the first piezoelectric sensor, and the first peak value of the tire deformation velocity, the first peak value being based on the measurement result of the second piezoelectric sensor.

Due to these arrangements, the inference unit can accurately infer the degree of the deterioration of the tire.

The tire deterioration inferring device may further have a communication unit capable of communicating with the outside and a warning unit that gives a warning command when the inference unit infers that the tire has deteriorated.

When it is inferred by the inference unit that the tire has deteriorated, a warning from the warning unit can be output through the communication unit to notify the driver or vehicle manager.

According to the present invention, the degree of the deterioration of a tire can be accurately inferred by using a first peak value, with a smaller amount of calculation.

BRIEF DESCRIPTION OF THE DRAWINGS

FIG. 1 is a flowchart of a tire deterioration inferring method in a first embodiment;

FIG. 3 is a flowchart of a tire deterioration inferring method in a second embodiment;

FIG. 4 is a flowchart of a tire deterioration inferring method in a third embodiment;

DESCRIPTION OF THE PREFERRED EMBODIMENTS

Figure 2A:
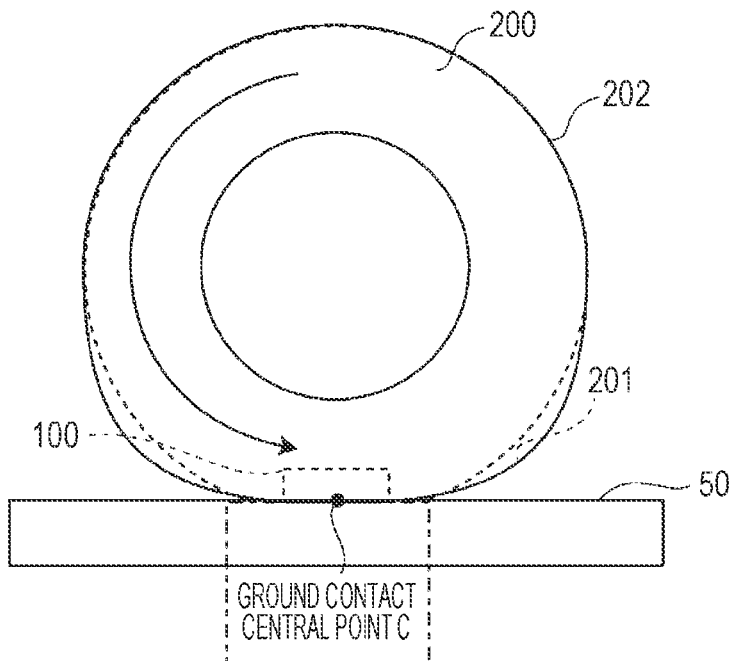
FIG. 2A is a schematically illustrates deformation of a tire while it is rotating.

Embodiments of the present invention will be described with reference to the drawings. In the drawings, like members and like processes (steps) are assigned like reference characters and descriptions will be appropriately omitted.

First Embodiment

As illustrated in FIG. 1, a tire deterioration inferring method in this embodiment uses a tire deterioration inferring device placed on the inner surface of a tire. The method includes a deformation velocity measurement step (S11), a calculation step (S12), and an inference step (S13). These steps will be described below.

Figure 2B:
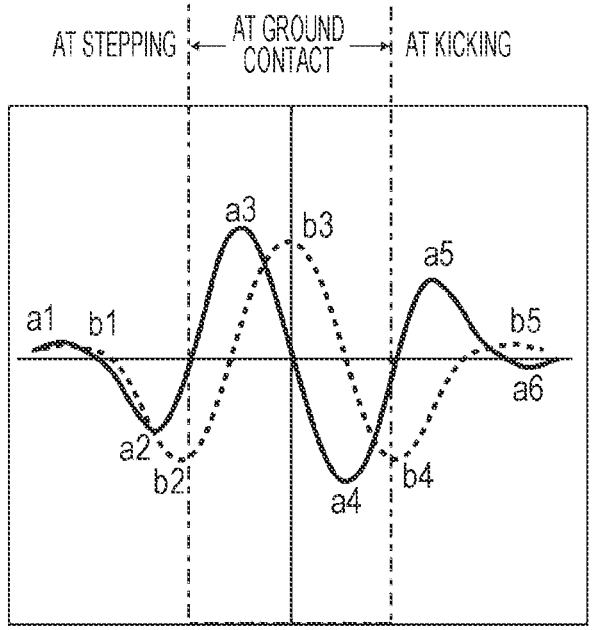
FIG. 2B is a waveform graph illustrating changes in the deformation velocity (solid line) of the tire and the amount of deformation (broken line)

The deformation velocity measurement step (S11) is a step of measuring a tire deformation velocity, which is the deformation velocity of the tire 200 during rotation at a portion where the tire deterioration inferring device 100 is placed. FIG. 2A is a front view schematically illustrating deformation while the tire 200 is rotating. FIG. 2B is a waveform graph schematically illustrating time-series changes in the tire deformation velocity and the amount of deformation of the tire 200, which are measured by the tire deterioration inferring device 100 on the tire 200 while it is rotating. In the drawing, the solid line indicates time-series changes in the tire deformation velocity, and the broken line indicates time-series changes in the amount of deformation of the tire 200.

The tire deterioration inferring device 100 measures the deformation of the tire 200, the deformation being generated as the portion where a deformation measurement unit 10 (see FIG. 5) is placed repeats stepping, a ground contact, and kicking on a road surface 50 due to the rotation of the tire 200, as illustrated in FIG. 2A. Along with the rotation of the tire 200, the deformation measurement unit 10 (see FIGS. 5 and 7) in the tire deterioration inferring device 100 measures periodic changes. In the deformation velocity measurement step, these periodic changes in the tire deformation velocity of the tire 200 are measured. The horizontal axis of the graph in FIG. 2B indicates time and the vertical axis indicates the magnitude of the tire deformation velocity or the amount of deformation of the tire 200. The solid line simplifies the waveform of time-series changes in the tire deformation velocity, and the broken line simplifies the waveform of time-series changes in the amount of deformation of the tire 200.

In the calculation step (S12), peak values, which are the values (maximum value and minimum value) of wave peaks of the waveform that represents time-series changes in the tire deformation velocity, are calculated from the time-series changes in the tire deformation velocity, the time-series changes having been measured in the deformation velocity measurement step. Here, peaks that give peak values of the tire deformation velocity are classified into first peaks and second peaks. The first peaks appear when a tire surface 202 corresponding to the portion where the tire deterioration inferring device 100 is placed on the inner surface 201 of the tire 200 is not in contact with the road surface 50. The second peaks appear when the tire surface 202 is in contact with the road surface 50. These peaks will be described with reference to FIGS. 2A and 2B.

As illustrated in FIGS. 2A and 2B, the first peaks, which are peaks when the tire surface 202 is not in contact with the road surface 50, are composed of peaks before and at stepping (peaks a1 and a2 in FIG. 2B) and peaks at and after kicking (peaks a5 and a6 in FIG. 2B). At a ground contact between the tire surface 202 and the road surface 50, the amount of deformation of the tire 200 is maximized (FIG. 2A). Peaks a3 and a4, which face in mutually opposite directions, appear as the second peaks before and after the central point at the ground contact (the central point will be appropriately referred to below as the ground contact central point C) (FIG. 2B).

In the calculation step, the first peaks before and at stepping, that is, before the ground contact of the tire 200, or the first peaks at and after kicking, that is, after the ground contact of the tire 200, are obtained. As illustrated in FIG. 2B, two peaks, a1 and a2, appear before peak a3 at the ground contact, and two peaks, a5 and a6, appear after peak a4 at the ground contact. Of these four peaks, peak a2, which is generated at a position close to peak a3 at the ground contact, and peak a5, which is generated at a position close to peak a4 at the ground contact, have a larger absolute peak value than peaks a1 and a6. This makes it easy to detect peaks a2 and a5. Therefore, it is preferable to use peaks a2 and a5, at which the absolute value of the tire deformation velocity is maximized, during other than the ground contact between the tire surface 202 and the road surface 50, that is, before and at the stepping of the tire 200 and at and after the kicking of the tire 200, as the first peaks. In this description, the peak generated immediately before the ground contact central point C on the same side as peak a3 at the ground contact is also referred to as the top peak. Similarly, the peak generated immediately after the ground contact central point C on the same side as peak a4 at the ground contact is also referred to as the bottom peak. In the waveform in FIG. 2B, of the first peaks, peaks a1 and a5 are top peaks and peaks a2 and a6 are bottom peaks, for example.

In the inference step (S13), the degree of the deterioration of the tire 200 is inferred by using first peak values, which are the values of first peaks in time-series changes in the tire deformation velocity, the values having been calculated in the calculation step. A comparison is made between a threshold value and an index obtained by using a first peak value. If the index is smaller than or equal to the threshold value (Yes in S13), it is decided that the tire 200 has deteriorated (S14), terminating the tire deterioration inference. If the index is greater than the threshold value (No in S13), a return is made to the deformation velocity measurement step (S11).

In the inference step (S13), first peak values are used to infer the degree of the deterioration of the tire 200. Therefore, the calculation step (S12) obtains at least first peak values included in the peak values of the tire deformation velocity.

Figure 9A:
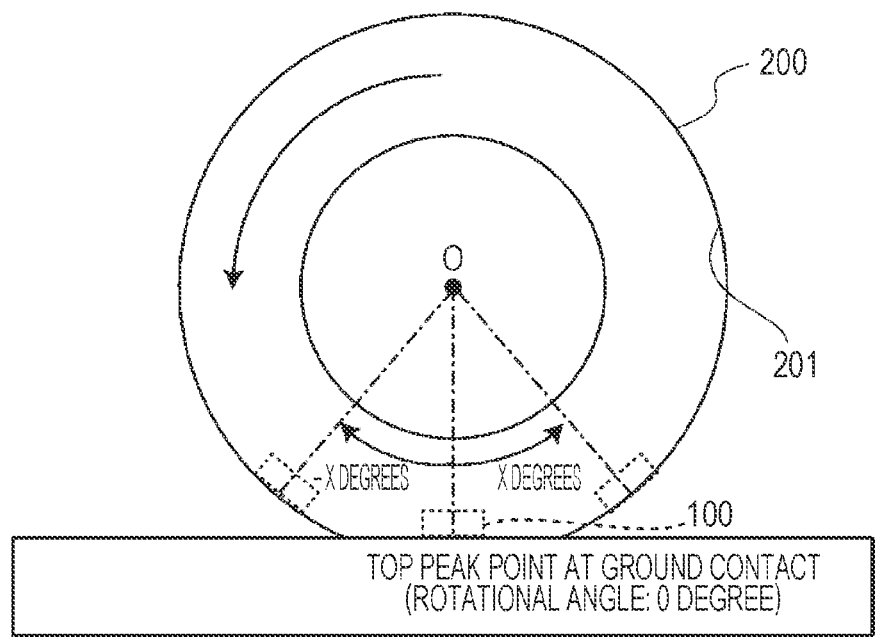
FIG. 9A is a plan view illustrating the rotation of the tire and the position (rotational angle) of the tire deterioration inferring device.
Figure 9B:
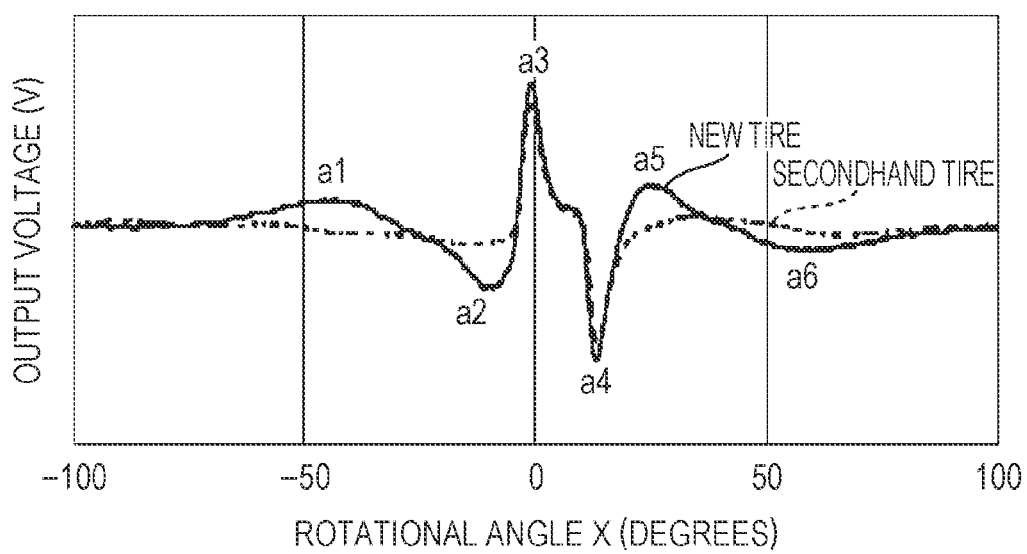
FIG. 9B is a waveform graph illustrating the relationship between the rotational angle of the tire and the output voltage from a piezoelectric sensor in the deformation measurement unit.

Here, FIG. 9B will be referenced. FIG. 9B illustrates, for a new tire, a waveform representing the relationship between the rotational angle of the tire 200 and the output voltage from a piezoelectric sensor in the deformation measurement unit 10, and also illustrates this type of waveform for a secondhand tire. From FIG. 9B, it is found that there is almost no difference in the output values at peaks a3 and a4 at a ground contact between the new tire and the secondhand tire, but there is a difference at peaks a1, a2, a5, and a6 before and after the ground contact therebetween. That is, it is found that the maximum value of the deterioration velocity of the tire 200 more sensitively reflects the extent of the deterioration of the tire 200, particularly a change in property, such as hardness, due to the deterioration before or after the ground contact than at the ground contact, at which the tire 200 is in contact with the ground. Therefore, the deterioration state of the tire 200 can be accurately inferred by inferring the degree of the deterioration of the tire 200 by using a first peak value, which is a peak value of the tire deformation velocity before or after the ground contact of the tire 200, the peak value having been obtained in the calculation step. For example, when it is detected that the peak value of peak a2 or a5 is smaller than or equal to a predetermined threshold value or that the peak value of peak a2 or a5 has fallen to or below a predetermined ratio with respect to the initial value of the relevant peak value, it is inferred that the tire 200 has deteriorated. The predetermined ratio can be set to, for example, 40% to 60%, 50%, or the like.

Second Embodiment

A tire deterioration inferring method in this embodiment differs from the first embodiment in that the method has a calculation step (S22) instead of the calculation step (S12) described above, as illustrated in FIG. 3. Besides the first peak values, the calculation step (S22) calculates second peak values of the tire deformation velocity at the ground contact of the tire 200.

Each second peak has the maximum peak value on the top side or bottom side. When the second peak values are calculated in the calculation step (S22) besides the first peak values, the first peak values and second peak values can be used in an inference step (S23). Accordingly, since the effects of changes in the properties of the tire 200 due to changes in external temperature and the like can be considered, inference accuracy can be enhanced.

During the ground contact of the tire 200, one second peak appears before the ground contact central point C in one direction of the waveform and another one second peak appears after the ground contact central point C in the opposite direction, as illustrated in FIG. 2B. On the waveform in FIG. 2B, peaks a3 and a4 immediately before and immediately after the ground contact central point C, at which the amount of deformation of the tire 200 is maximized, are the second peaks. The values of the deformation velocity at these peaks are second peak values. The second peak values are each the maximum value of the deformation velocity of the tire 200 in the opposite directions at the ground contact of the tire 200.

In this embodiment, the second peak values are calculated in the calculation step (S22) besides the first peak values. Therefore, an index obtained by using a first peak value and a second peak value can be used in the inference of the deterioration of the tire 200 in the inference step (S23) following the calculation step (S22). When the second peak value is used besides the first peak value, accuracy in inference can be improved with the suppression of the effect of elements other than the extent of the deterioration of the tire 200. For example, since all materials tend to become hard in a low-temperature environment, their output waveforms change analogously to output waveforms at ordinary temperatures. Therefore, even when a first peak value and a second peak value change due to changes in the external environment, the ratio between the second peak value and the first peak value remains the same. When wear occurs, however, the effect of wires becomes large because only the tread rubber is worn off, so the output waveforms do not become analogous. Accordingly, when the ratio between the second peak value and first peak value is used as an index, it is possible to suppress the effect of an environment such as external temperature.

In the inference step (S23), a first ratio or a second ratio, for example, can be used when the degree of the deterioration of the tire 200 is inferred; the first ratio is obtained by dividing the peak value of peak a2 (first peak) in FIG. 2B by the peak value of peak a3 (second peak), and the second ratio obtained by dividing the peak value of peak a5 (first peak) by the peak value of peak a4 (second peak). This is just an example of a combination of a first peak value and a second peak value. Peak values other than these may be combined. In addition, a ratio obtained by dividing a second peak value by a first peak value may be used.

In the inference step (S23), it is decided that the tire 200 has deteriorated when, for example, the ratio of a first peak value to a second peak value has fallen to or below a predetermined ratio with respect to a reference value (S14). When the ratio is not smaller than or equal to the predetermined ratio with respect to the reference value, a return is made to the deformation velocity measurement step (S11) and the measurement of time-series changes in the deterioration velocity of the tire 200 is continued. An example of the reference value is the ratio (initial value) of a first peak value of the tire 200 at a point in time before the tire 200 is used (that is, the tire 200 is new) to a second peak value of the tire 200. Although the predetermined ratio may take an appropriate value, it suffices to set the predetermined value to, for example, 40% to 60% or 50% according to the type of the tire 200 or the like.

Third Embodiment

A tire deterioration inferring method in this embodiment infers the degree of the deterioration of the tire 200 by using third peak values of the amount of deformation of the tire 200, the third peak values being identified from time-series changes (broken line in FIG. 2B) in the amount of deterioration of the tire 200, instead of time-series changes (solid line in FIG. 2B) in the tire deformation velocity of the tire 200.

The tire deterioration inferring method in this embodiment has a deformation amount measurement step (S31), a calculation step (S32), and an inference step (S33), as illustrated in FIG. 4.

In the deformation amount measurement step (S31), time-series changes in the amount of deformation of the tire 200 are measured. For example, the deformation velocity of the tire 200 is measured while the tire 200 is rotating, and then the amount of deformation of the tire 200 is measured by integrating the tire deformation velocity. Accordingly, a waveform, indicated by the broken line in FIG. 2B, of time-series changes in the amount of deformation of the tire 200 is obtained.

In the calculation step (S32), peak values of the amount of deformation of the tire 200 are identified from the time-series changes in the amount of deformation of the tire 200. As illustrated in FIG. 2B, peaks b1 and b2 before and at stepping, a peak b3 at a ground contact, at which the amount of deformation is maximized, and peaks b4 and b5 at and after kicking are generated on the waveform of time-series changes in the amount of deformation.

Of peaks b1 to b5 described above, third peaks are b1, b2, b4, and b5. The third peaks of the amount of deformation of the tire 200 sensitively reflect changes in the elasticity of the tire 200 due to deterioration, as with the first peaks in the first embodiment. In the inference step (S33), therefore, it is decided that the tire 200 has deteriorated when an index obtained by using a third peak value in the amount of deformation of the tire 200 is smaller than or equal to a threshold value (S14), so the degree of the deterioration of the tire 200 can be accurately inferred.

In the calculation step (S32), a fourth peak value at which the amount of deformation is maximized may be obtained besides the third peak values. When the fourth peak value is used besides the third peak values, the effects of temperature changes and the like can be suppressed as with the tire deformation velocity. Therefore, inference accuracy in the inference step (S33) is improved. In the inference step (S33), a value obtained by dividing a third peak value by the fourth peak value may be used as an index with which the extent of the deterioration of the tire 200 is evaluated. In this case, if the index is smaller than or equal to a predetermined ratio (threshold value) with respect to an initial value (Yes in S33), for example, it is decided that the tire 200 has deteriorated. If the index is not smaller than or equal to the predetermined ratio (threshold value) with respect to the initial value (No in S33), a return is made to the deformation amount measurement step (S31) and the calculation step (S32) and inference step (S33) are repeated.

Fourth Embodiment

Figure 5:
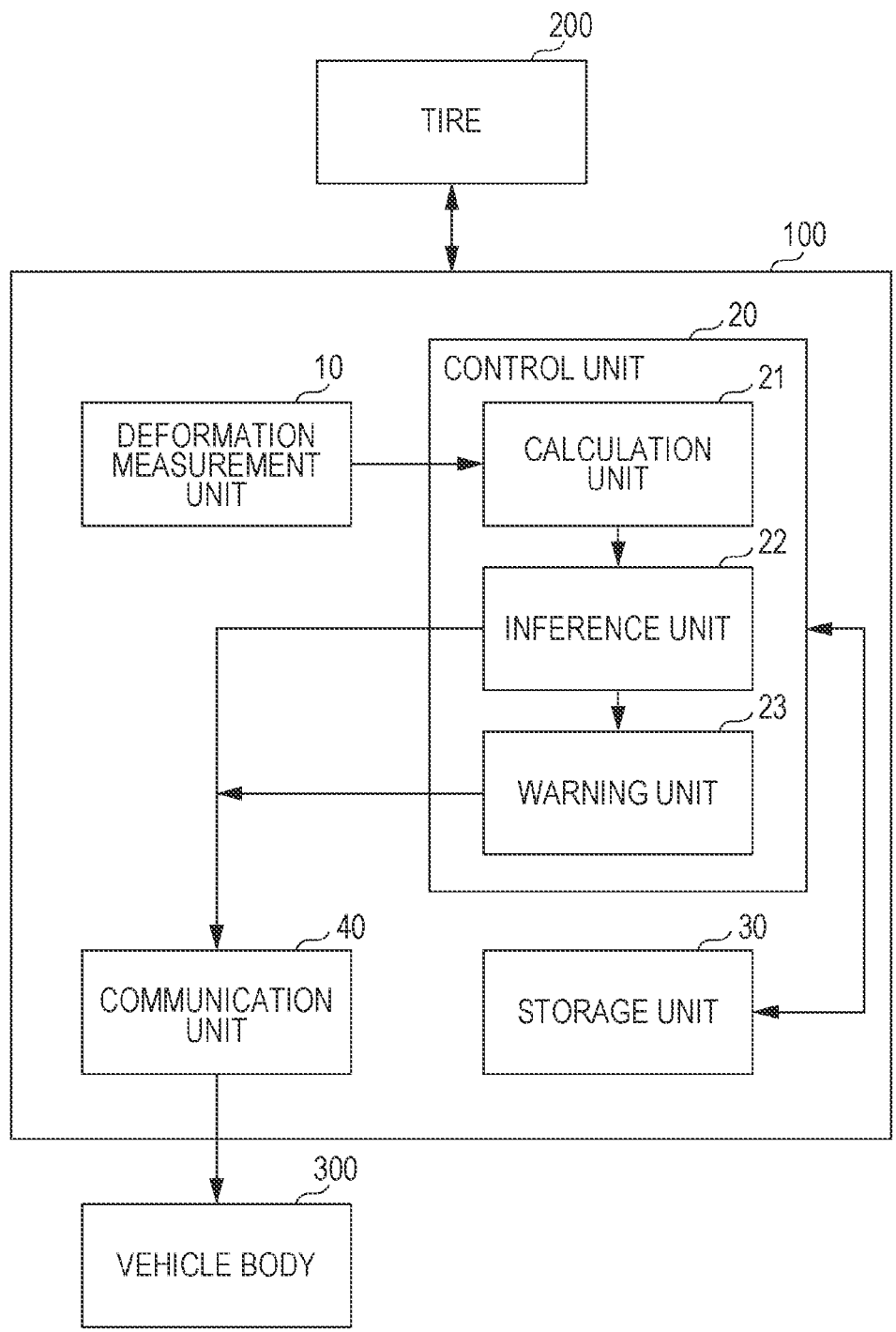
FIG. 5 is a functional block diagram of a tire deterioration inferring device.

FIG. 5 is a functional block diagram of the tire deterioration inferring device 100 in this embodiment. The tire deterioration inferring device 100 is placed on the inner surface 201 (see FIG. 2A) of the tire 200 to determine the extent of the deterioration of the tire 200. The tire deterioration inferring device 100 has the deformation measurement unit 10, a calculation unit 21, and an inference unit 22.

The deformation measurement unit 10 can measure the deformation velocity of the tire 200 while the tire 200 is rotating. As the deformation measurement unit 10, a piezoelectric sensor, for example, can be used that is formed like a sheet having a structure in which a piezoelectric body layer formed by dispersing piezoelectric particles in a synthetic resin matrix is sandwiched between electrode layers. The deformation measurement unit 10 may be placed so as to be in contact with the inner surface 201 of the tire 200. The deformation measurement unit 10 may measure the deformation velocity on the inner surface 201 of the tire 200, and may output a measurement result to the calculation unit 21 as the tire deformation velocity.

The calculation unit 21 calculates, from time-series changes in the tire deformation velocity measured by the deformation measurement unit 10, peak values in the time-series changes in the tire deformation velocity. With the waveform, indicated by the solid line in FIG. 2B, of time-series changes in the tire deformation velocity, the calculation unit 21 may calculate the peak values of peaks a1 and a2 (first peaks) before and at the stepping of the tire 200 (before a ground contact) and peaks a5 and a6 (first peaks) at and after the kicking of the tire 200 (after the ground contact), the peak values of peaks a3 and a4 (second peaks) at the ground contact, and the like. Peak values can be calculated from data of time-series changes in the tire deformation velocity or by analyzing an image of the waveform of the time-series changes.

The inference unit 22 infers the degree of the deterioration of the tire 200 by using the first peak values calculated in the calculation unit 21.

The calculation unit 21 and inference unit 22 are part of a control unit 20 in charge of various types of control by the tire deterioration inferring device 100. As illustrated in FIG. 5, the control unit 20 may have a warning unit 23 that indicates that the tire 200 has deteriorated. When the degree of the deterioration of the tire 200, the degree being inferred by the inference unit 22, becomes smaller than or equal to a predetermined threshold value, the control unit 20 outputs a signal that gives a warning about the deterioration of the tire 200. A central processing unit (CPU) or the like may be used as the control unit 20. The calculation unit 21, inference unit 22, and warning unit 23 may be structured as software functions.

Besides the deformation measurement unit 10 and control unit 20 described above, the tire deterioration inferring device 100 in this embodiment may have a storage unit 30 and a communication unit 40. Various types of data are recorded in the storage unit 30. The recorded data is referenced when, for example, the control unit 20 infers the deterioration state of the tire 200 or gives a warning. Data stored in the storage unit 30 includes, for example, a table that indicates the relationship between indexes used in evaluation and the degrees of the deterioration of the tire 200. The inference unit 22 can accurately infer the deterioration state of the tire 200 through a comparison between information stored in the storage unit 30 and an index based on a first peak value calculated by the calculation unit 21. The storage unit 30 may be a storage unit included in an external device such as a vehicle body 300 that can communicate with the tire deterioration inferring device 100.

The calculation unit 21 calculates first peaks values of the tire deformation velocity before and after the portion where the deformation measurement unit 10 is disposed comes into contact with the ground, from the time-series changes in the tire deformation velocity measured by the deformation measurement unit 10. With the waveform, indicated by the solid line in FIG. 2B, of time-series changes in the tire deformation velocity, the calculation unit 21 calculates the first peak values, which are the maximum values of the deformation velocity at peaks a1 and a2 before and at the stepping of the tire 200 (before the ground contact) and at peaks a5 and a6 at and after the kicking of the tire 200 (after the ground contact), that is, at all peaks.

The inference unit 22 infers the degree of the deterioration of the tire 200 by using the first peak values calculated in the calculation unit 21. With the waveform of time-series changes in the tire deformation velocity, the maximum peaks a3 and a4 are respectively generated on the top side and bottom side at the ground contact, as indicated in FIG. 2B. The present invention can accurately infer the deterioration state of the tire 200 by using the value or values of the first peak or first peaks generated before the largest peak a3 on the top side and/or after the largest peak a4 on the bottom side (before and/or after the ground contact), that is, the value of peak a1, a2, a5, and/or a6.

In addition to the first peak values described above, the calculation unit 21 may calculate second peak values of the tire deformation velocity at the ground contact of the tire 200. Then, the inference unit 22 may infer the degree of the deterioration of the tire 200 by using the first peak values and second peak values. For example, the inference unit 22 may evaluate the degree of the deterioration of the tire 200 by using an index obtained by dividing a first peak value by a second peak value.

In this case, it is preferable to use a combination of the maximum first peak value of the tire deformation velocity before or after the ground contact of the tire 200 and a second peak value that is the maximum value of the tire deformation velocity at the ground contact of the tire 200. For example, the values (a2/a3), (a2/a4), (a5/a3), (a5/a4), each of which is obtained by dividing the peak value of peak a2 or peak a5 in FIG. 2B by the peak value of peak a3 or peak a4, and the like can be used as an index.

Also, the deformation measurement unit 10 may obtain time-series changes in the amount of deformation of the tire 200, the amount being obtained by integrating the tire deformation velocity, instead of the tire deformation velocity. In this case, the calculation unit 21 calculates, from time-series changes in the amount of deformation of the tire 200, third peak values of the amount of deformation of the tire 200 before and at the stepping of the tire 200 or at and after the kicking of the tire 200 as well as the fourth peak value of the amount of deformation of the tire 200 at the ground contact of the tire 200. Then, the inference unit 22 infers the degree of the deterioration of the tire 200 according to the ratio between a third peak value and the fourth peak value. For example, the value (b2/b3 or b4/b3) obtained by dividing the peak value (third peak value) of peak b2 or b4 on the waveform of time-series changes in the amount of deformation of the tire 200, the waveform being indicated by the broken line in FIG. 2B, by the peak value (fourth peak value) of peak b3 may be used as an index with which the deterioration state of the tire 200 is evaluated.

As the deformation measurement unit 10, a piezoelectric sensor formed like, for example, a sheet can be used. It is preferable for the piezoelectric sensor to have a first piezoelectric sensor 11 and a second piezoelectric sensor 12 that has sensitivity different from that of the first piezoelectric sensor 11 in the deformation direction of the tire 200, as illustrated in FIGS. 6A and 6B.

Figure 6A:
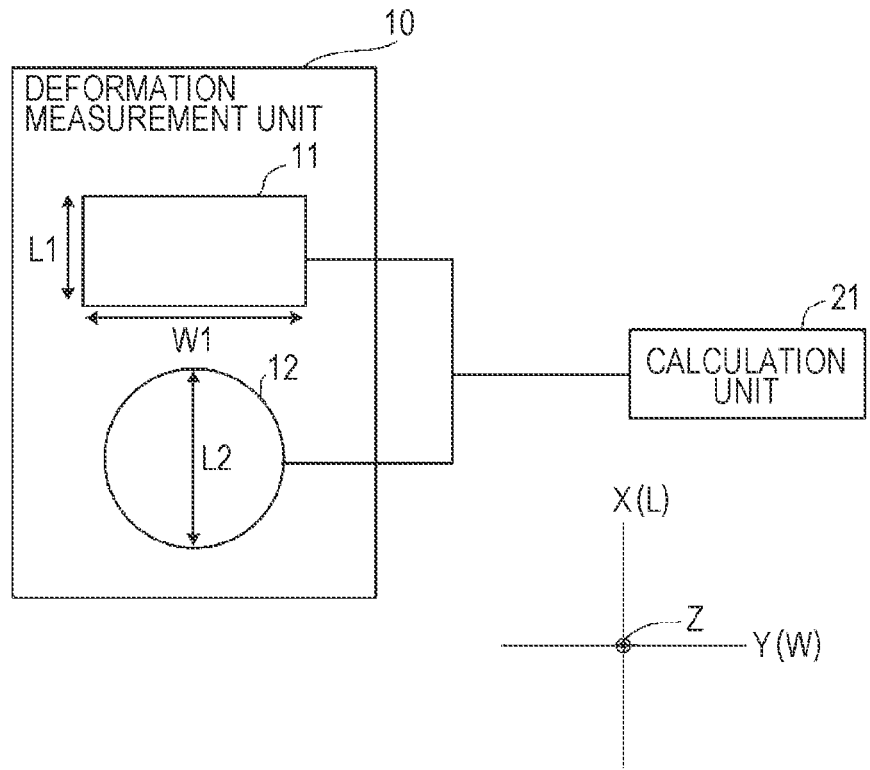
FIG. 6A is a plan view schematically illustrating an example of the structure of a deformation measurement unit in the tire deterioration inferring device.
Figure 6B:
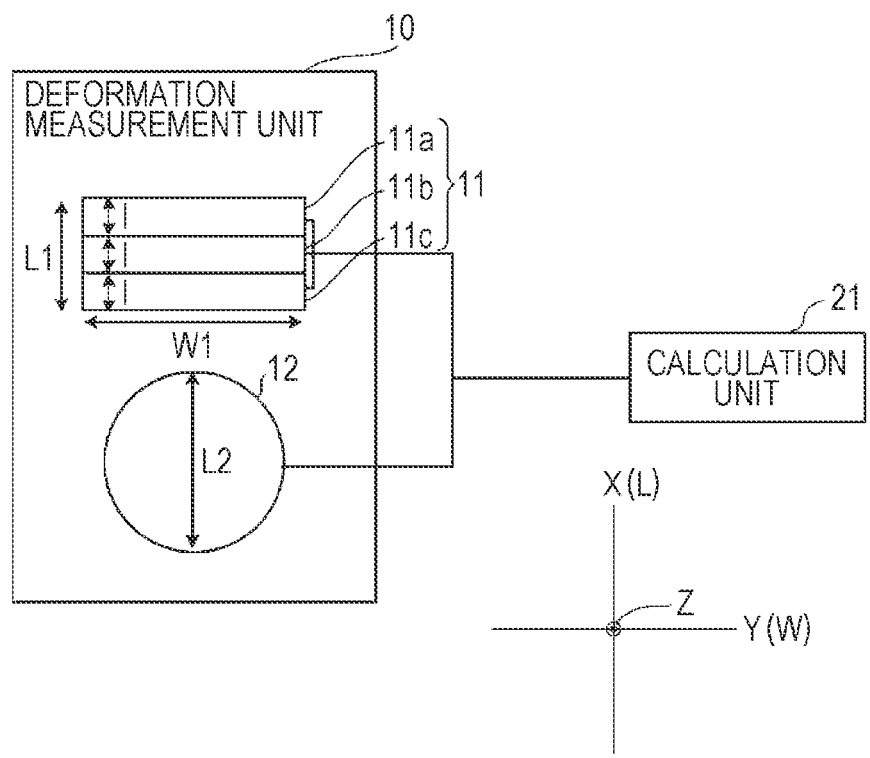
FIG. 6B is a plan view schematically illustrating an example of another structure of the deformation measurement unit.

The deformation measurement unit 10 may have a structure in which, for example, the first piezoelectric sensor 11 is formed in a rectangular shape when viewed from the normal direction (Z-axis direction) and the second piezoelectric sensor 12 is formed in a circular shape when viewed from the normal direction, as illustrated in FIG. 6A. When the first piezoelectric sensor 11 is formed in an anisotropic shape in the X-axis direction and Y-axis direction and the second piezoelectric sensor 12 is formed in a non-anisotropic shape in the X-axis direction and Y-axis direction as described above, the deformation velocity can be measured in a particular direction besides the size of the deformation of the tire 200 at the portion where the deformation measurement unit 10 is disposed. For example, it is adapted that when deformation equally occurs in all directions, the output from the first piezoelectric sensor 11 and the output from the second piezoelectric sensor 12 are the same and that when the deformation velocity in the width direction of the tire 200 is large, the output from the first piezoelectric sensor 11 is larger than the output from the second piezoelectric sensor 12. Then, the deformation direction of the tire 200 can be determined from the difference between the output of the first piezoelectric sensor 11 and the output of the second piezoelectric sensor 12.

The inference unit 22 may obtain the deformation velocity in a particular direction by using the difference between the output of the first piezoelectric sensor 11 and the output of the second piezoelectric sensor 12. In this case, since the difference between these outputs is small, the difference between the output of the first piezoelectric sensor 11 and the output of the second piezoelectric sensor 12 may be amplified before the difference is used.

For example, the first piezoelectric sensor 11 may be placed so that its longitudinal direction matches the width direction W (Y-axis direction) of the tire 200. Then, deformation mainly in the width direction W of the tire 200 can be accurately measured by the first piezoelectric sensor 11. The tire 200 greatly deforms in the width direction W before and after a ground contact, as will be described later. Accordingly, when the first piezoelectric sensor 11 is used, it becomes possible to accurately measure the deformation velocity particularly before and after a ground contact. Although, in the examples in FIGS. 6A and 6B, the deformation measurement unit 10 has both the first piezoelectric sensor 11 and the second piezoelectric sensor 12, the deformation measurement unit 10 may have a structure in which only one of the first piezoelectric sensor 11 and second piezoelectric sensor 12 is provided.

To measure a force applied in the width direction W with high sensitivity and to enlarge the output, the aspect ratio (W1:L1) of the first piezoelectric sensor 11 is preferably 10:1 or more and 10:10 or less, more preferably 10:3 or more and 10:8 or less, and still more preferably 10:4 or more and 10:6 or less. A structure may also be formed in which a plurality of cutouts extending in the longitudinal direction (Y-axis direction) are formed.

The length W1 of the first piezoelectric sensor 11 in the width direction W of the tire 200 is preferably about 10 to 20 mm. As the shape (length L1 in the rotational direction (circumferential direction)×length W1 in the width direction W) of the first piezoelectric sensor 11, 5 mm×10 mm and 7 mm×15 mm, for example, are taken. The diameter L2 of the first piezoelectric sensor 11 is preferably about 5 to 20 mm.

FIG. 6B a plan view schematically illustrating an example of another structure of the deformation measurement unit 10. The first piezoelectric sensor 11 may have a structure in which about two to five piezoelectric sensors 11a, 11b, and 11c having the same shape (rectangular shape) are aligned in parallel to the rotational direction of the tire 200, as illustrated in the drawing. Due to this structure, accuracy in the measurement of the deformation velocity in the width direction W is improved. In this structure, the length W1 of the first piezoelectric sensor 11 in the width direction W is equal to the length W1 of the piezoelectric sensors 11a, 11b, and 11c in the width direction W, and the length L1 of the first piezoelectric sensor 11 in the rotational direction of the tire 200 is a value (31) obtained by summing the lengths 1 of the piezoelectric sensors 11a, 11b, and 11c. Although, in the example in FIG. 6B, the piezoelectric sensors 11a, 11b, and 11c having the same shape are used, piezoelectric sensors having different shapes may be used. The piezoelectric sensors 11a, 11b, and 11c may be placed so as to be spaced.

Figure 7:
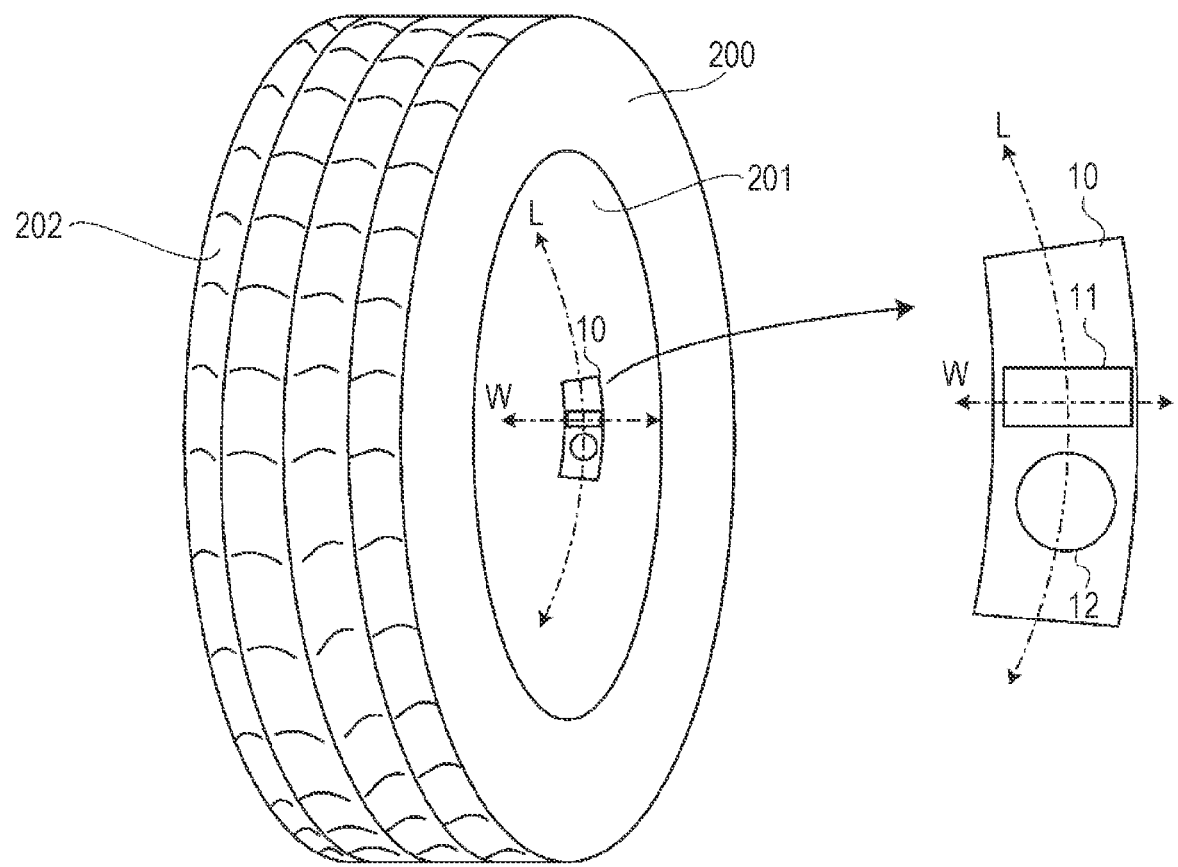
FIG. 7 is a perspective view schematically illustrating where the deformation measurement unit in FIG. 6A or 6B is placed on the inner surface of the tire.

FIG. 7 schematically illustrates a state in which the deformation measurement unit 10 having the first piezoelectric sensor 11 and second piezoelectric sensor 12 is disposed on the inner surface 201 of the tire 200. It is preferable for the first piezoelectric sensor 11 and second piezoelectric sensor 12 to be placed on the same straight line along the rotational direction L of the tire 200, as illustrated in the drawing. This can restrain the position of the tire 200 in the width direction W from affecting the first piezoelectric sensor 11 and second piezoelectric sensor 12. Therefore, it is possible to accurately measure the difference between the output from the first piezoelectric sensor 11 and the output from the second piezoelectric sensor 12.

In the inference of the degree of the deterioration of the tire 200 by the inference unit 22, one or both of peak values based on the measurement result of the first piezoelectric sensor 11 and peak values based on the measurement result of the second piezoelectric sensor 12 may be used.

The inference unit 22 may also infer the degree of the deterioration of the tire 200 according to the difference between first peak values based on the measurement results of the first piezoelectric sensor 11 and first peak values based on the measurement results of the second piezoelectric sensor 12. The greater the deformation velocity in the width direction W of the tire 200 is, the greater the difference is between the output of the first piezoelectric sensor 11, which has superior sensitivity to the deformation in the width direction W (Y-axis direction), and the output of the second piezoelectric sensor 12, which does not cause a difference in sensitivity depending on the deformation direction. The deformation velocity in the width direction W greatly varies before and after a ground contact due to property changes caused by the deterioration of the tire 200. Therefore, when the difference between outputs from sensors with different detection sensitivities in the width direction W of the tire 200 is used, it is possible to detect a change in the deformation velocity in the width direction W and accurately infer the degree of the deterioration of the tire 200.

The control unit 20 in the tire deterioration inferring device 100 in this embodiment has the warning unit 23 that gives a warning command when the inference unit 22 infers that the tire 200 has deteriorated. The output from the inference unit 22 described above and/or the output from the warning unit 23 is output to the vehicle body 300 through the communication unit 40. The deterioration state of the tire 200 is displayed on a display device included in the vehicle body 300 or the like or a warning based on a sound or light is issued, according to the output from the inference unit 22 and/or warning unit 23. The communication unit 40 may send the output to a mobile terminal such as a smart phone or to an external server or the like through a public communication line, besides the vehicle body 300.

Information obtained by the tire deterioration inferring device 100 in relation to the state of the tire 200 may be used alone or in combination of information obtained from another device. An example of the other device is a tire pressure monitoring system (TPMS), which monitors the air pressure of the tire of an automobile, and the like.

In the embodiment described above, the tire deterioration inferring device 100 having the deformation measurement unit 10, control unit 20, storage unit 30, and communication unit 40 has been described. However, this is just an example. The deformation measurement unit 10 and communication unit 40 may constitute the tire deterioration inferring device 100. In this structure, an electronic control unit (ECU) included in the vehicle body 300 fulfills the functions of the control unit 20, calculation unit 21, inference unit 22, and warning unit 23. A storage means can be used with which the communication unit 40 can communicate through a communication line and that is included in a device such as the vehicle body 300. The ECU acquires information related to the deterioration state of the tire 200 by using a wireless communication means such as a Bluetooth (registered trademark) device to communicate with the tire deterioration inferring device 100 and to receive only data for several seconds while, for example, the vehicle body 300 keeps a speed of about 40 to 60 km/hour.

Examples

Distortion Property of the Tire 200

Figure 8:
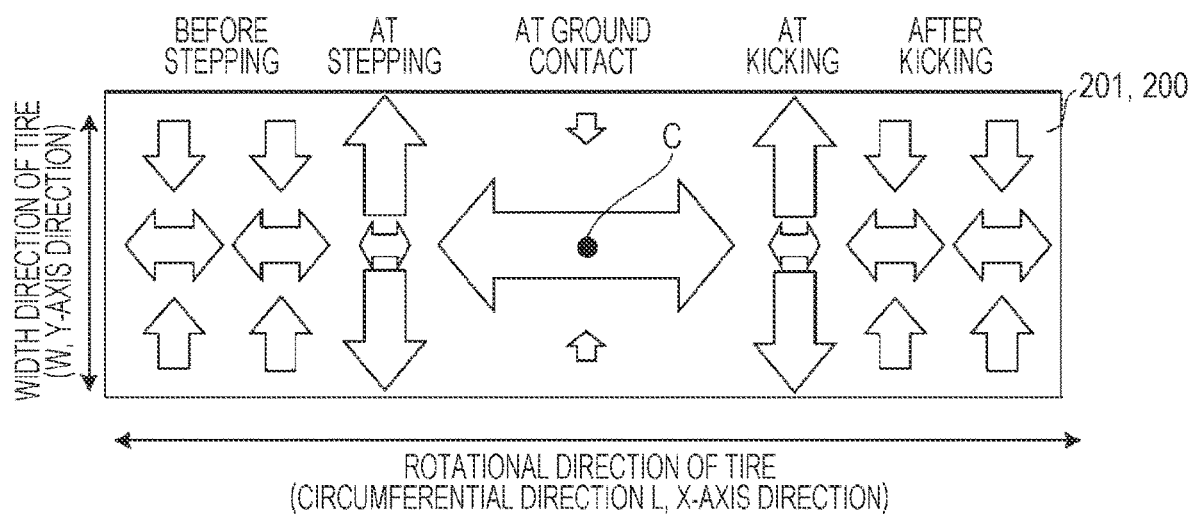
FIG. 8 is a plan view schematically illustrating the velocity and direction, obtained by a simulation, of the deformation of the inner surface of the tire.

FIG. 8 is schematically illustrates simulation results of the property of distortion caused in the inner surface 201 of the tire 200 during rotation, that is, the deformation direction and the magnitude of the deformation velocity before stepping, at stepping, at a ground contact, at kicking, and after kicking. The orientation of each open arrow in the drawing indicates the deformation direction, and the size of the open arrow indicates the magnitude of the deformation velocity. The tire 200 tends to elongate in the rotational direction L and to contract in the width direction W due to the air pressure of air sealed in the interior. However, elongation in the rotational direction L is dominant at a ground contact, and elongation in the width direction W is dominant at stepping and at kicking.

The tire 200 during rotation (traveling) receives a perpendicular load due to a ground contact as well as a centrifugal force due to rotation or a force due to curvature deformation in the width direction W of the tire 200. While the tire 200 is rotating, the portion in contact with the ground periodically changes, so the perpendicular load applied to individual portions periodically changes. The behavior of the tire 200 at a ground contact, at which a state in which this force is applied is in progress, can be handled as peaks a3 and a4 illustrated in FIG. 2A.

At the stepping portion and kicking portion immediately before and immediately after the tire 200 comes into contact with the road surface 50, the elongation of the tire 200 in the rotational direction L is mitigated and, at the same time, the contraction in the width direction W is mitigated. Accordingly, the tire 200 elongates in the width direction W due to the effect of the centrifugal force by the rotation. When the behavior of the tire 200 before and at the stepping and at and after the kicking is measured with a piezoelectric sensor or the like, peaks a1 and a2 (before and at the stepping) and peaks a5 and a6 (at and after the kicking) on the output waveform in FIG. 2B can be obtained. The terms "before and at stepping" and "at and after kicking" identify the range of one cycle of the periodic deformation of the portion where the tire deterioration inferring device 100 is disposed, the deformation being caused along with the rotation of the tire 200.

Evaluation of New Tire and Secondhand Tire

FIG. 9B is a graph (waveform) illustrating measurement results of output voltage, accompanying the rotation of the tire 200, from the first piezoelectric sensor 11 in a rectangular plane shape (a set of three piezoelectric sensors with a size of 10 mm×6 mm and a size of 10 mm×2 mm, see FIG. 6B), the first piezoelectric sensor 11 being placed on the inner surface 201 of the tire 200 (new tire and secondhand tire) so that the longitudinal direction of the first piezoelectric sensor 11 is parallel to the width direction W of the tire 200. The rotational angle X refers to an angle formed by the straight line that connects the top peak point, illustrated in FIG. 9A, of the tire 200 at a ground contact and the rotational center O of the tire 200 and the straight line that connects the rotational center O and the tire deterioration inferring device 100. With respect to the top peak point at the ground contact, the stepping side will be referred to below as the negative (−) side and the side at and after the kicking after the ground contact will be referred to below as the positive (+) side. The top peak point at the ground contact refers to the position of the tire deterioration inferring device 100 at which peak a3, which is the peak that appears first at the ground contact as illustrated in FIG. 9B, is obtained.

In FIG. 9B, the waveform obtained by measuring the new tire is indicated by the solid line, and the waveform obtained by measuring the secondhand tire is indicated by the broken line. The secondhand tire is a tire 200 that has suffered from both a change in property such as hardness and a reduction in thickness due to wear. From the waveforms in the drawing, the maximum values (peaks a3 and a4) of the output voltage were obtained at the ground contact of the tire 200 on both the top side and the bottom side and a plurality of peaks (a1, a2, a5, and a6) were obtained before and after the ground contact of the tire 200. These peaks before and after the ground contact of the tire 200 had a smaller peak value than the peaks at the ground contact of the tire 200. However, there was a great difference in peak values before and after the ground contact of the tire 200 between the new tire and the secondhand tire. It was found from this result, the extent of the deterioration of the tire 200 can be accurately evaluated by using the peak values of peaks before and after the ground contact of the tire 200.

Effect of the Shape of the Piezoelectric Sensor

Table 1 below and FIG. 10A indicate results obtained by placing the tire deterioration inferring device 100, having the deformation measurement unit 10 composed of the first piezoelectric sensor 11 in a rectangular plane shape (a set of three piezoelectric sensors with a size of 10 mm×6 mm and a size of 10 mm×2 mm, see FIG. 6B), on the inner surface 201 of the tire 200 (new tire and secondhand tire) so that the longitudinal direction of the first piezoelectric sensor 11 is parallel to the width direction W of the tire 200, and then measuring outputs from the first piezoelectric sensor 11.

TABLE 1

| Rectangular piezoelectric sensor | New tire | Secondhand tire | Secondhand tire/new tire |
|---|---|---|---|
| a2 | 0.58 | 0.18 | 0.31 |
| a3 | 1.10 | 0.92 | 0.84 |
| a2/a3 | 0.53 | 0.20 | 0.38 |
| a4 | 1.01 | 0.86 | 0.85 |
| a5 | 0.35 | 0.11 | 0.30 |
| a5/a4 | 0.34 | 0.12 | 0.36 |

Figure 10A:
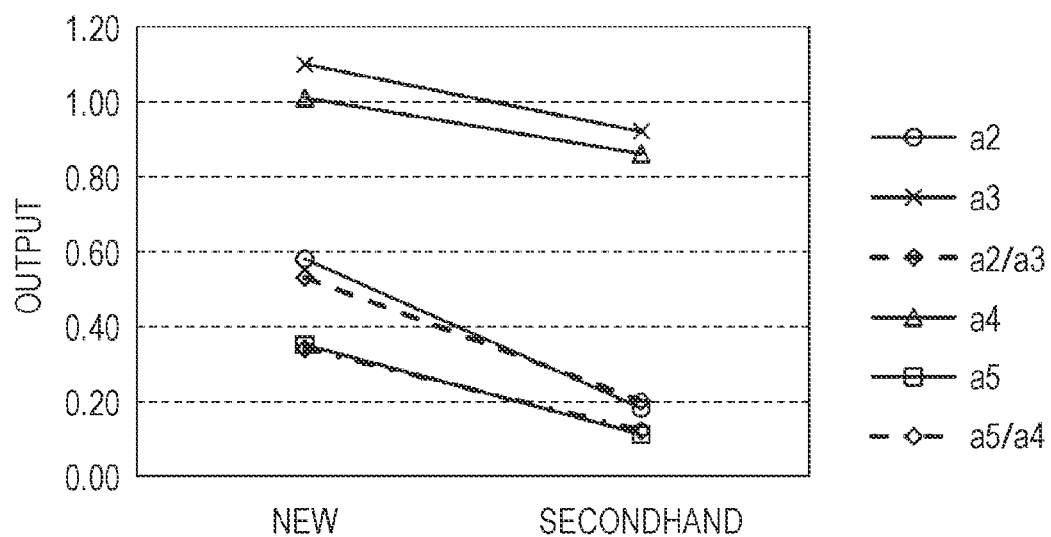
FIGS. 10A and 10B are each a graph illustrating changes in peak values of the waveforms of a new tire and a secondhand tire, FIG. 10A illustrating measurement results from a rectangular piezoelectric sensor, and FIG. 10B illustrating measurement results from a circular piezoelectric sensor.
Figure 10B:
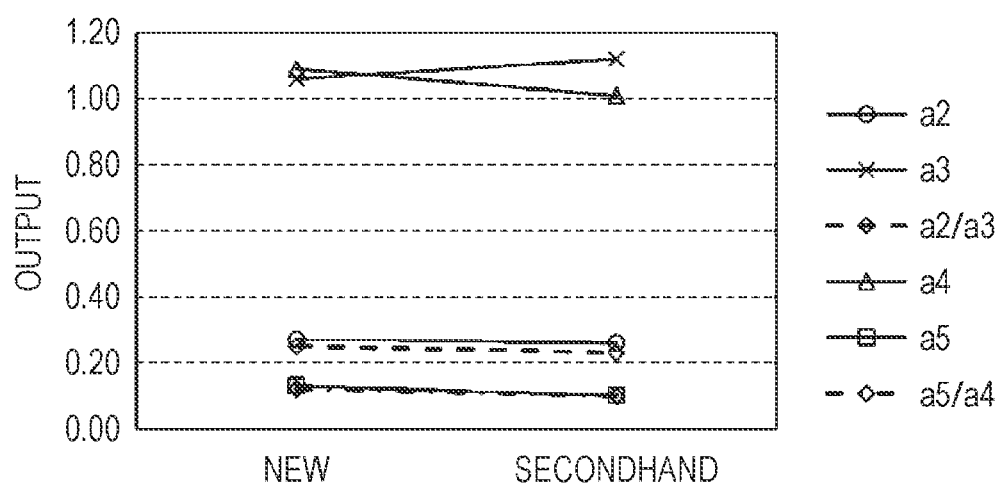

Table 2 and FIG. 10B indicate results obtained by placing the tire deterioration inferring device 100, having the deformation measurement unit 10 composed of the second piezoelectric sensor 12 in a circular plane shape (with a diameter L2 of 10 mm, see FIG. 6B), on the inner surface 201 of the tire 200 (new tire and secondhand tire) and then measuring outputs from the second piezoelectric sensor 12.

TABLE 2

| Circular piezoelectric sensor | New tire | Secondhand tire | Secondhand tire/ new tire |
|---|---|---|---|
| a2 | 0.27 | 0.26 | 0.96 |
| a3 | 1.06 | 1.12 | 1.06 |
| a2/a3 | 0.25 | 0.23 | 0.92 |
| a4 | 1.09 | 1.01 | 0.93 |
| a5 | 0.13 | 0.10 | 0.77 |
| a5/a4 | 0.12 | 0.10 | 0.83 |

Evaluation of the New Tire Before and After Buffing

Figure 11A:
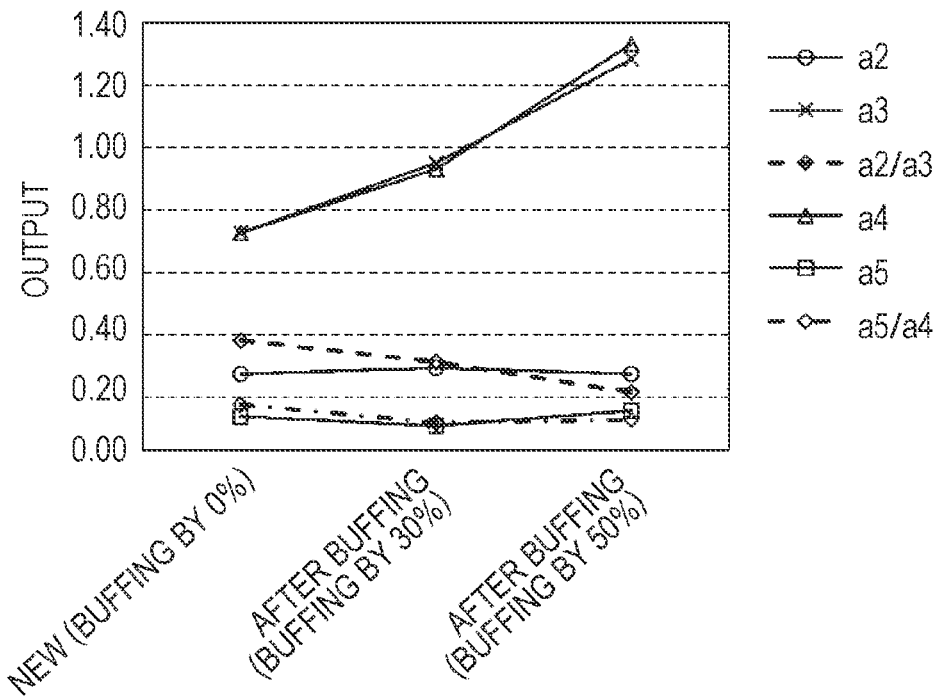
FIGS. 11A and 11B are each a graph illustrating changes in peak values of the waveforms of a new tire and a tire worn with a buff, FIG. 10A illustrating measurement results from the rectangular piezoelectric sensor and FIG. 10B illustrating measurement results from the circular piezoelectric sensor.

Table 3 and FIG. 11A indicate results obtained by placing the tire deterioration inferring device 100, having the deformation measurement unit 10 composed of the first piezoelectric sensor 11 in a rectangular plane shape (a set of three piezoelectric sensors with a size of 10 mm×2 mm, see FIG. 6B), on the inner surface 201 of the tire 200 (new tire) so that the longitudinal direction of the first piezoelectric sensor 11 is parallel to the width direction W of the tire 200 and then performing measurement before the rubber of the tire surface 202 was trimmed by buffing by a predetermined thickness (initial value: 0%) and after the trimming (buffing by 30% and 50% of the whole).

TABLE 3

| Rectangular piezoelectric sensor | New tire (buffing: 0%) | After buffing (buffing: 30%) | After buffing (buffing: 50%) | After buffing (buffing: 50%)/ new tire |
|---|---|---|---|---|
| a2 | 0.25 | 0.27 | 0.25 | 0.97 |
| a3 | 0.71 | 0.94 | 1.28 | 1.81 |
| a2/a3 | 0.36 | 0.29 | 0.19 | 0.53 |
| a4 | 0.71 | 0.92 | 1.33 | 1.86 |
| a5 | 0.11 | 0.08 | 0.13 | 1.19 |
| a5/a4 | 0.15 | 0.09 | 0.10 | 0.64 |

Figure 11B:
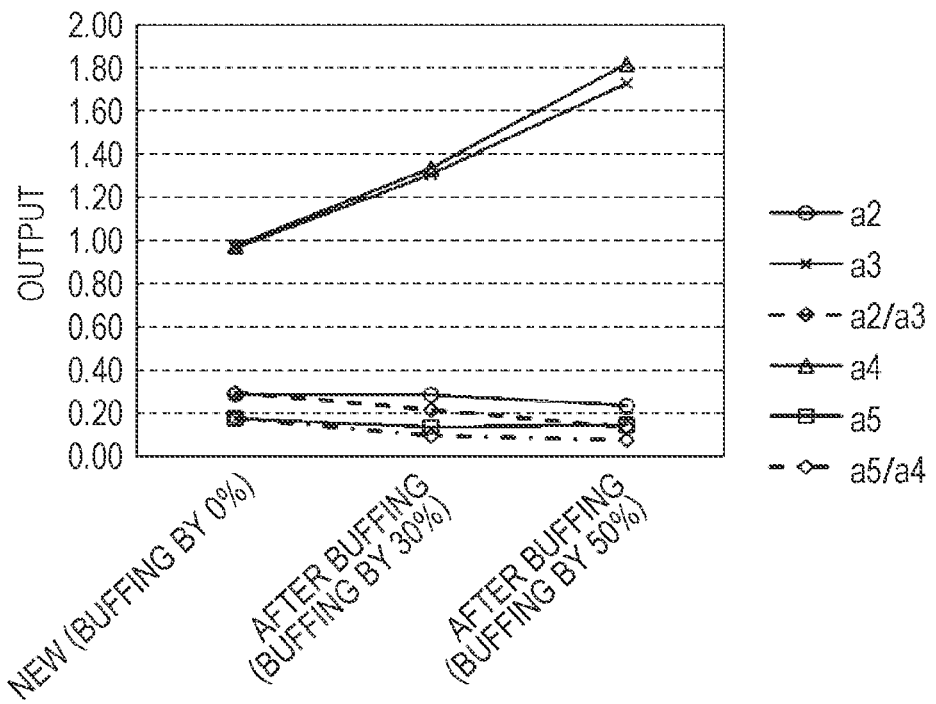

Table 4 and FIG. 11B indicate results obtained by placing the tire deterioration inferring device 100, having the deformation measurement unit 10 composed of the second piezoelectric sensor 12 in a circular plane shape (with a diameter L2 of 10 mm, see FIG. 6B), on the inner surface 201 of the tire 200 and then measuring outputs from the piezoelectric sensor.

TABLE 4

| Circular piezoelectric sensor | New tire 200 (buffing: 0%) | After buffing (buffing: 30%) | After buffing (buffing: 50%) | After buffing (buffing: 50%)/ new tire |
|---|---|---|---|---|
| a2 | 0.29 | 0.29 | 0.24 | 0.82 |
| a3 | 0.97 | 1.31 | 1.73 | 1.78 |
| a2/a3 | 0.30 | 0.22 | 0.14 | 0.46 |
| a4 | 0.98 | 1.34 | 1.82 | 1.85 |
| a5 | 0.18 | 0.14 | 0.15 | 0.80 |
| a5/a4 | 0.18 | 0.10 | 0.08 | 0.43 |

For the results for a2/a3 and a5/a4 in Tables 1 to 4, Table 5 below compiles ratios of values after deterioration (values for the secondhand tire or values after buffing) to values for the new tire.

TABLE 5

| Table 5-1 | Piezoelectric sensor | New tire | Secondhand tire | Secondhand tire/new tire |
|---|---|---|---|---|
| a2/a3 | Rectangular | 0.53 | 0.20 | 0.38 |
|  | Circular | 0.25 | 0.23 | 0.92 |
| a5/a4 | Rectangular | 0.34 | 0.12 | 0.36 |
|  | Circular | 0.12 | 0.10 | 0.83 |

| Table 5-2 | Piezoelectric sensor | New tire | After buffing (buffing: 50%) | After buffing (buffing: 50%) /new tire |
|---|---|---|---|---|
| a2/a3 | Rectangular | 0.36 | 0.19 | 0.53 |
|  | Circular | 0.30 | 0.14 | 0.46 |
| a5/a4 | Rectangular | 0.15 | 0.10 | 0.64 |
|  | Circular | 0.18 | 0.08 | 0.43 |

FIG. 10 is graphs for comparing peak values obtained by measuring the new tire and secondhand tire. FIG. 10A indicates measurement results when a rectangular piezoelectric sensor was used as the deformation measurement unit 10, and FIG. 10B indicates measurement results when a circular piezoelectric sensor was used as the deformation measurement unit 10.

Changes in the behavior of the tire 200, the changes accompanying the deterioration of the tire 200, could be regarded as changes in peaks on a time-dependent waveform of the deformation velocity of the tire 200. When a rectangular piezoelectric sensor in a rectangular plane shape, the sensor having superior sensitivity in the width direction W of the tire 200, is used, the extent of the deterioration of the tire 200 could be detected with high sensitivity, as illustrated in FIGS. 10A and 10B. The difference between the waveform of the new tire and the waveform of the secondhand tire was greater at peaks a2 and a5 before and after the ground contact than at peaks a3 and a4 at the ground contact, so the extent of the deterioration of the tire 200 could be detected with high sensitivity.

FIGS. 11A and 11B are graphs for comparing peak values obtained in measurement in which the new tire was forcibly worn by using a buff. FIG. 11A indicates measurement results when a rectangular piezoelectric sensor was used as the deformation measurement unit 10, and FIG. 11B indicates measurement results when a circular piezoelectric sensor was used as the deformation measurement unit 10.

Changes in the behavior of the tire 200, the changes accompanying the progress of the wear of the tire 200, could be regarded as changes in peaks on a time-dependent waveform of the deformation velocity of the tire 200, as illustrated in FIGS. 11A and 11B. There was no great difference between the piezoelectric sensors used in the measurement, that is, piezoelectric sensor in a circular plane shape and piezoelectric sensor in a rectangular plane shape, the sensor having superior sensitivity in the width direction W of the tire 200. The degree of the progress of the wear of the tire 200 could be detected with higher sensitivity at peaks a3 and a4 at the ground contact than at peaks a2 and a5 before and after the ground contact.

Of the peaks on a time-dependent waveform of the deformation velocity of the tire 200, peaks at which sensitivity was superior differed depending on whether the deterioration of the tire 200 was due to wear or a change in property such as hardness, as illustrated in FIGS. 10A and 10B and FIGS. 11A and 11B. However, when values (first peaks/second peaks, that is, a2/a3 and a5/a4) obtained by dividing first peak values before and after the ground contact by second peak values at the ground contact are used as indexes in tire deterioration, it is possible to detect both changes in property such as time-dependent changes in flexibility and a reduction caused by wear in the thickness of rubber and then infer the deterioration state of the tire 200. Specifically, since the value of "first peak/second peak" becomes smaller as the deterioration of the tire 200 proceeds, it is possible to infer both wear that is accompanied by time-dependent deterioration and abrupt wear that is not accompanied by time-dependent deterioration by using a change from an initial value as an evaluation index. Since the difference between the new tire and the secondhand tire can be accurately detected, it can be said that it is preferable to use a rectangular piezoelectric sensor as the deformation measurement unit 10.

The present invention is useful as a method and a device that infer the extent of the deterioration of a tire.

What is claimed is:

1. A method for estimating deterioration of a tire, using a tire deterioration estimation device including a sheet-shaped piezoelectric sensor placed on an inner surface of the tire, the piezoelectric sensor including a first piezoelectric sensor and a second piezoelectric sensor having different sensitivities in a direction in which the tire deforms, the method comprising:
measuring a tire deformation velocity while the tire is rotating, thereby obtaining a periodic change of the tire deformation velocity, the measuring including:
measuring a deformation velocity of the inner surface of the tire as the tire deformation velocity with the first and second piezoelectric sensors;

calculating at least one peak value of the tire deformation velocity from the periodic change of the tire deformation velocity, the at least one peak value including:
a first peak value based on a measurement result of the first piezoelectric sensor and obtained at or before stepping of the tire, or at or after kicking of the tire; and
a second peak value based on a measurement result of the second piezoelectric sensor and obtained at the ground contact of the tire; and
estimating a degree of deterioration of the tire using the first peak value and the second peak value of the tire deformation.

2. The method according to claim 1,
wherein the estimating includes:
estimating the degree of the deterioration of the tire according to a ratio between the second peak value and the first peak value.

3. The method according to claim 2, wherein the estimating estimates the degree of the deterioration of the tire according to:
a first ratio obtained by dividing the first peak value before the ground contact by the second peak value, or
a second ratio obtained by dividing the first peak value after the ground contact by the second peak value.

4. The method according to claim 2, wherein the estimating estimates that the tire has deteriorated when the ratio of the first peak value to the second peak value falls to 50% or less of a reference value.

5. A device for estimating a deterioration state of a tire, configured to be placed on an inner surface of the tire, the device comprising:
a deformation measurement unit configured to measure a tire deformation velocity while the tire is rotating, the deformation measurement unit including a sheet-shaped piezoelectric sensor configured to be in contact with the inner surface of the tire and measure a deformation velocity of the inner surface of the tire as the tire deformation velocity, the piezoelectric sensor including a first piezoelectric sensor and a second piezoelectric sensor having different sensitivities in a direction in which the tire deforms;
a calculation unit configured to calculate at least one peak value of the tire deformation velocity from a periodic change in the tire deformation velocity, the at least one peak value including:
a first peak value obtained at or before stepping of the tire, or at or after kicking of the tire based on a measurement result of the first piezoelectric sensor; and
a second peak value obtained at the ground contact of the tire based on a measurement result of the second piezoelectric sensor; and
an estimation unit configured to estimate a degree of deterioration of the tire using the first peak value and the second peak value of the tire deformation.

6. The device according to claim 5, wherein the first piezoelectric sensor has a higher sensitivity in a width direction of the tire than the second piezoelectric sensor.

7. The device according to claim 6,
wherein the first piezoelectric sensor is formed in a rectangular shape when viewed from a normal direction of a main surface of the sheet shape, and is placed so that a longitudinal direction matches the width direction of the tire;

and wherein the second piezoelectric sensor is formed in a circular shape when viewed from the normal direction.

8. The device according to claim 6,
wherein the estimation unit is configured to estimate the degree of deterioration of the tire according to a difference between the first peak value of the tire deformation velocity based on the measurement result of the first piezoelectric sensor, and the first peak value of the tire deformation velocity based on the measurement result of the second piezoelectric sensor.

9. The device according to claim 5, wherein the first piezoelectric sensor and the second piezoelectric sensor are placed on a same straight line along a rotational direction of the tire.

10. The device according to claim 5, wherein the estimation unit is configured to estimate the degree of the deterioration of the tire according to a ratio of the first peak value to the second peak value.

11. The device according to claim 5, further comprising:
a communication unit capable of communicating with an outside; and
a warning unit configured to issue a warning command when the estimation unit estimates that the tire has deteriorated.

* * * * *